United States Patent [19]

Chalmers

[11] 4,379,202
[45] Apr. 5, 1983

[54] SOLAR CELLS
[75] Inventor: Bruce Chalmers, Falmouth, Mass.
[73] Assignee: Mobil Solar Energy Corporation, Waltham, Mass.
[21] Appl. No.: 277,905
[22] Filed: Jun. 26, 1981
[51] Int. Cl.³ .......................................... H01L 31/04
[52] U.S. Cl. .................................... 136/256; 136/259
[58] Field of Search .............................. 136/256, 259

[56] References Cited
U.S. PATENT DOCUMENTS
4,053,327 10/1977 Meulenberg, Jr. .................. 136/256

OTHER PUBLICATIONS
H. Oman, "Solar Cells for Solar Power Satellites", Proceedings, European *Symposium on Photovoltaic Generators In Space,* Noordwijk, Sep. 1978, pp. 133–138.

Primary Examiner—Aaron Weisstuch
Attorney, Agent, or Firm—Schiller & Pandiscio

[57] ABSTRACT

A solar cell having a periodic front surface electrode is provided with a transparent cover chosen and configured to provide refractive discontinuities of the same spatial frequency as and aligned with the conductive grid. The refractive discontinuities are so controlled, through selection of the shape, disposition, and refractive index of the cover, as to cause a ray initially normal to the surface of the cell which would otherwise be intercepted by the electrode to miss the electrode and fall on the photosensitive material.

10 Claims, 10 Drawing Figures

SOLAR CELLS

This invention relates to solar cells, and more particularly to apparatus and methods for reducing the effect of shadowing of the active material of such cells by the front electrodes. The invention may also be used to reduce the series resistive losses of the cells.

Photovoltaic cells, commonly known as solar cells, are a well known means for producing electrical current from electromagnetic radiation. Typically, these devices are junction diodes fabricated from appropriately doped semiconductor materials. Such devices are typically fabricated as thin, flat wafers with the junction formed parallel to and near one of the flat surfaces. The device is intended to be illuminated through this, the so-called front, surface. Electromagnetic radiation absorbed by the semiconductor produces electron-hole pairs in the semiconductor. Those electron-hole pairs formed near the junction may be separated by the junction's electric field, thereby producing a photocurrent. This photocurrent may be applied to an external load by conductors attached respectively to the n- and p- regions on either side of the junction. Because the front region is perforce thin, it possesses a relatively high lateral resistivity. Consequently, the device will suffer large resistive losses unless the conductive means attached to this region is somehow distributed over the surface. Such a conductive means will generally obscure a portion of the surface. Thus, the effective collection area of the solar cell is reduced by a shadowing loss due to the extent of the front surface conductors. The cell simultaneously experiences a resistive loss proportional to the spacing and inversely proportional to the cross-section of the front surface conductors. Configuring and dimensioning the front surface conductor so as to minimize the shadowing losses results in an increase in the resistive losses. Tradeoffs between these sources of loss result in solar cells in which nevertheless still some 10% of the cell is obscured by the front conductors. In addition, since the tradeoff is at best a compromise, such cells also suffer from considerable resistance losses. Further, optimum designs generally result in complex and fragile front conductor geometries.

Accordingly, it is an object of the present invention to provide a means for reducing the shadowing loss produced by the front conductors of a solar cell. It is a further object of the present invention to provide for simultaneous reduction in the shadowing losses while permitting closer spacing of larger front surface conductors, thereby reducing resistive losses as well. Yet another object of the present invention is to provide optimum reduction of shadowing and resistive losses while simultaneously permitting the use of a simple robust front surface conductive grid.

These and other objects are met in the present invention of a combination comprising a solar cell with a periodic front surface conductive grid and a contacting transparent cover chosen and configured to provide refractive discontinuities of the same spatial frequency as the conductive grid. In a preferred embodiment, the conductive grid is in the form of a simple comb, with like conductive fingers parallel to one another and equally spaced apart, and the transparent cover is in the form of a series of plano-convex cylindrical lenses having the same spacial frequency as the comb. The cylindrical axes are arranged to be parallel to and equidistant from pairs of adjacent fingers of the comb, and the curvature of the cylinders and the thickness and refractive index of the cover are chosen to deflect a ray initially normal to the surface of the cell and marginally incident upon a cylindrical lens so as to displace its intercept with the cell by a distance equal to half the thickness of a finger.

It will be appreciated that in this way virtually all of the electromagnetic radiation initially normal to the cell's front surface and falling on the transmissive cover can be made to fall on the semiconductor between the conductive fingers. As a consequence, the cover virtually eliminates the shadowing loss due to the front conductors. Further, the latitude in choices of refractive index and radius of curvature of the cylindrical array permits the conductive fingers to be both wider and more closely spaced, still with little or no shadowing, thereby reducing resistive losses. Yet again, this approach permits the use of the more desirable comb grid with robust fingers at no penalty compared to (indeed with a gain over) the former optimum efficiency complex multi-level grid. It will further be appreciated that the transparent cover can also serve as a protective cover. Through an appropriate choice of materials, it may also be used to reduce Fresnel losses normally experienced by high index semiconductive materials.

Other objects of the invention will in part be obvious and will in part appear hereinafter. The invention accordingly comprises the apparatus possessing the construction, combination of elements and arrangement of parts which are exemplified in the following detailed disclosure and the scope of the application of which will be indicated in the claims. For a fuller understanding of the nature and objects of the present invention reference should be had to the following detailed description taken in connection with the accompanying drawings wherein:

It will be understood that the various views are for purposes of illustration only, and that certain dimensions have been exaggerated for purposes of clarity.

In all the drawings, like numbers refer to like members.

Figure 1:
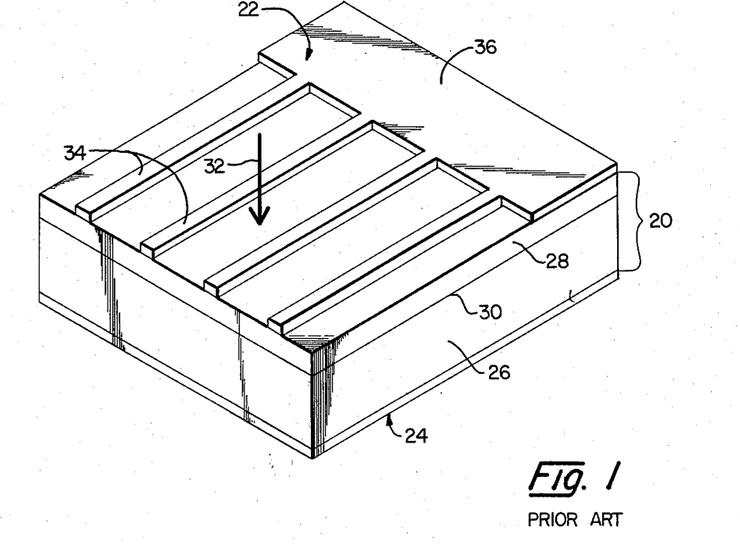
FIG. 1 is a perspective view of a prior art solar cell with simple front surface conductive grid geometry.

Referring to FIG. 1 there is shown a perspective view of a typical solar cell. The solar cell comprises a semiconductor structure, generally identified by numeral 20, sandwiched between front and rear conductive structures (electrodes) generally indicated by numerals 22 and 24 respectively. While semiconductor structure 20 may be any of various well known photovoltaic structures, for purposes of illustration an n-p silicon solar cell will be described. Such a solar cell comprises a substrate 26 of p-type silicon together with a layer 28 of n-type material. An n-p junction 30 is formed at the interface between substrate 26 and layer 28. In use, it is intended that light incident on the device in the general direction indicated by arrow 32 will penetrate layer 28 and be absorbed by the silicon in the immediate vicinity of junction 30. The absorption of this radiation results in the formation of an electron-hole pair near the junction. An electric field directed toward substrate 26 exists at n-p junction 30. As a result, the photoelectrons produced by the photoabsorption flow from the vicinity of the junction toward the front (i.e., in the direction opposite arrow 32) of layer 28 to front conductive structure 22. The holes produced in the photoabsorption flow through substrate 26 to rear conductive structure 24. Front and rear conductive structures 22 and 24 may be connected together through an external load (not shown), thereby supplying the load with electrical power.

It should be noted that only those electron-hole pairs formed in the vicinity of junction 30 are effectively separated by the electric field at the junction into counter-flowing electrons and holes. Electron-hole pairs formed elsewhere in the semiconductor material more generally recombine. To be effective, the semiconductor must be highly absorbing. Consequently, the junction must be near the surface, the exact depth depending upon the absorbance of the semiconductor material. Typically, layer 28 is thin, e.g., in a silicon cell it has a depth of about 0.5 micron.

A number of competing effects influencing the performance of the cell are dependent upon the size and disposition of front conductive structure 22. While rear conductive structure 24 may be and typically is a metallic layer contacting the entire rear surface of substrate 26, in order that radiation incident on the cell may penetrate layer 28, front conductive structure 22 contacting the front surface of layer 28 is perforce an open structure. In the typical single-level grids of prior art devices, front conductive structure 22 is a comb-like metallic layer consisting of a plurality of equally spaced-apart fingers 34 normal to and communicating with a larger bus 36. Shadowing losses clearly depend upon the number and total area of fingers 34. The shadowing loss due to fingers 34 is typically on the order of 8 to 10%. Losses due to shadowing by bus 36 are relatively less important as typically the cells are used in a series array, the cells being stacked, shingle-like, with rear conductive structure 34 of one cell covering and contacting bus 36 of the adjacent cell. In such an array, only the bus 36 of the end cell in the series intercepts any useful radiation.

While decreasing the size of fingers 34 and increasing their spacing would result in smaller shadowing loss, such a design approach increases the resistive losses of the cell. Wide spacing of fingers 34 requires a major portion of the electrons resulting from the photoabsorption to flow sideways through the thin lamina of layer 28. As a result, large lateral resistive losses are incurred. Additionally, there are resistive losses through the contact area between layer 28 and fingers 34, as well as along the length of fingers 34. These last two resistive losses are also clearly aggravated by lessening the widths of fingers 34, all things otherwise being equal.

Figure 2:
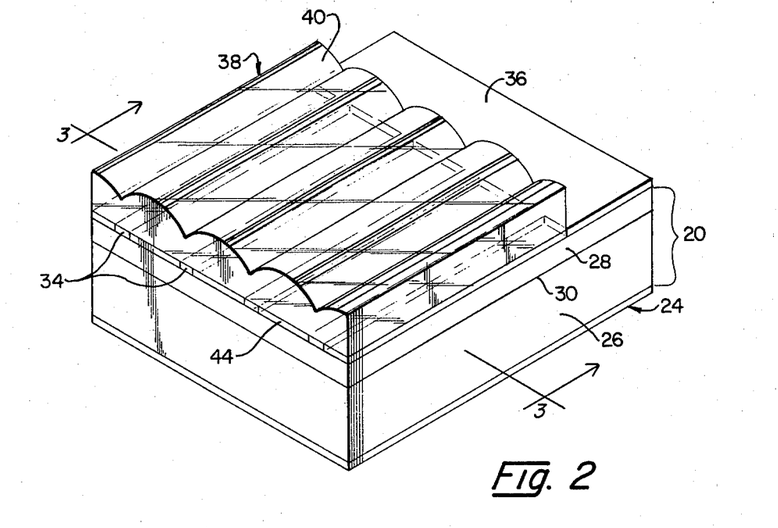
FIG. 2 is a perspective view, similar to FIG. 1, of a preferred embodiment of the present invention.
Figure 3:
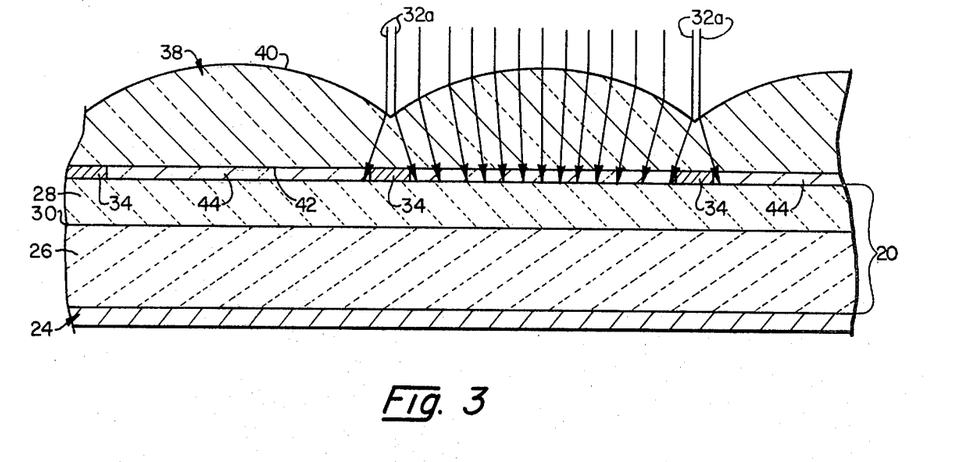
FIG. 3 is an enlarged fragmentary cross-sectional view of the embodiment of FIG. 2, taken along the line 3—3 of FIG. 2.

Turning now to FIGS. 2 and 3, there may be seen a preferred embodiment of the present invention comprising a solar cell provided with a transparent cover 38. Preferably, cover 38 is dimensioned and disposed to cover all of the front surface of the solar cell with the exception of the front surface of bus 36. Cover 38 may be fabricated of glass, fused quartz, polymers such as polymethyl methacrylate, polystyrene, or any similar transparent material. As will be described, refractive discontinuities are formed by shaping at least one surface (such as surface 40 in FIGS. 2 and 3) of cover 38 so that it comprises a number of similarly shaped segments with a spatial frequency substantially the same as that of fingers 34. The remaining surface (e.g., surface 42 in FIGS. 2 and 3) is preferably planar. The optical quality of cover 38 is not particularly critical. Consequently, it will be understood by those skilled in the art of mass-produced optical elements that cover 38 may be fabricated in any number of ways such as pressing, extrusion, or the like.

In the preferred embodiment of FIGS. 2 and 3, front surface 40 of cover 38 is shaped in the form of a series of similar convex cylindrical segments, and rear surface 42 of cover 38 is substantially planar in form, the plane of surface 42 being parallel to the plane containing the cylindrical axes of the segments forming front surface 40. Intended for use in air (or vacuum), cover 38 is in effect a series of parallel positive cylindrical lenses. The thickness of cover 38, and the radius of curvature of each cylindrical segment of surface 40, are chosen, depending on the index of refraction of the material of construction, so as to deflect marginal rays (i.e., the rays incident upon the junction between adjacent cylindrical segments, such as rays 32a) toward the optical axis of the respective cylinder a distance, as measured at rear surface 42, on the order of half the breadth of a finger 34. Cover 38 is disposed with the cylindrical axes parallel to and equidistant from adjacent fingers 34. Preferably, rear surface 42 abutts fingers 34, the interstices formed between the upper surface of layer 28 of structure 20, the rear surface 42 of cover 38, and fingers 34 being filled with adhesive 44. Adhesive 44 is preferably a highly transparent RTV cement, such as room temperature vulcanizing silicone epoxy, having a refractive index near that of cover 38. It will be understood, however, that adhesive 44 could be another material and that in particular adhesive 44 could be applied peripherally, the interstices between layer 28 and rear surface 42 being filled with air or an inert gas. Adhesive 44 also may be applied between the mutually confronting surfaces of layer 28 and cover 38.

Transparent cover 38 serves a multiple function. By diverting radiation which would otherwise be incident upon fingers 34 so as to be incident on an unobstructed portion of layer 28, cover 38 reduces the shadowing losses of the cell. It should also be noted that the same principle allows the cell to be configured to have even wider and more closely spaced collecting fingers and still have minimal shadowing losses. Thus, the present invention permits the simultaneous reduction of both shadowing losses and resistive losses below the level attainable by prior art devices.

It will be understood that the improved performance resulting from the controlled refraction of cover 38 is maximal for collimated light normally incident on the cell. This condition may be easily met in the case of direct sunlight, as the sun, as seen from the earth, subtends only about ½ degree, and the cell may be aligned with regard to the sun. It will be appreciated, however, that improved performance will still result for other sources and source-cell orientations. Further, those skilled in the art will recognize that the configuration of cover 38 may be modified to better adapt the cell to other source-cell orientations.

In addition to improving the performance of a solar cell by reducing shadowing losses, cover 38 also provides a protective cover. Further, as long as adhesive 44 has an index of refraction matching that of cover 38, the only refractive interface inside the construction is between adhesive 44 and layer 28. As is well known in the art, Fresnel losses at this interface can be minimized by the introduction of an odd quarter-wave layer (not shown) of a material chosen to have an index of refraction equal to the geometric mean of the indicies of layer 28 and cover 38 (and adhesive 44).

As illustrated, the inclination of marginal rays 32a has been emphasized in order to more clearly depict the principle of the invention. It should be noted that the maximum angle of incidence of a ray upon layer 28 is preferably kept small (i.e., near normal incidence). There are at least two important reasons for this. Firstly, at angles of incidence greatly different from zero, Fresnel losses at the front surface of layer 28 become increasingly important. Secondly, the increased angle of incidence also results in a greater path length between the front surface of layer 28 and junction 30. As a consequence of these two effects, for those rays highly inclined to the normal to layer 28, less energy penetrates the layer and less of that which does penetrate is effective in producing electron-hole pairs in the vicinity of the junction. It will be appreciated, however, that by controlling the separation between the refracting surface and layer 28 the need for extreme angles of incidence can be avoided. It will also be apparent that the refraction could be shared between a plurality of surfaces, with the result that a near normal incidence upon layer 28 could be maintained for all rays, as will be described hereinafter.

Figure 8:
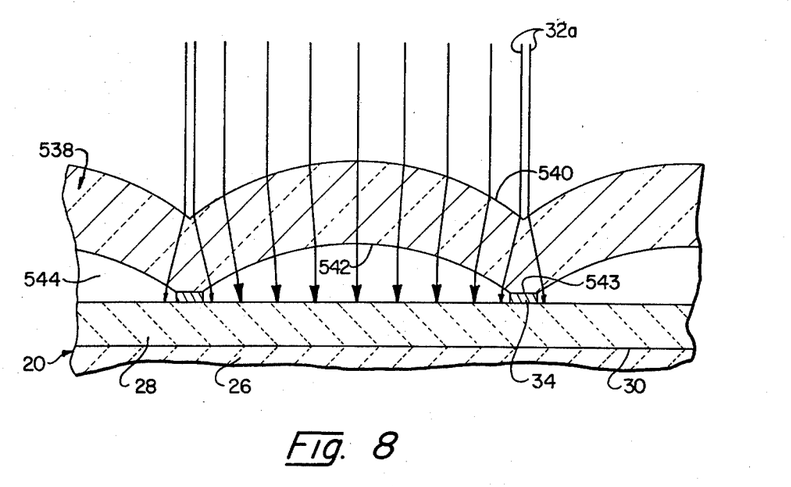
Figure 9:
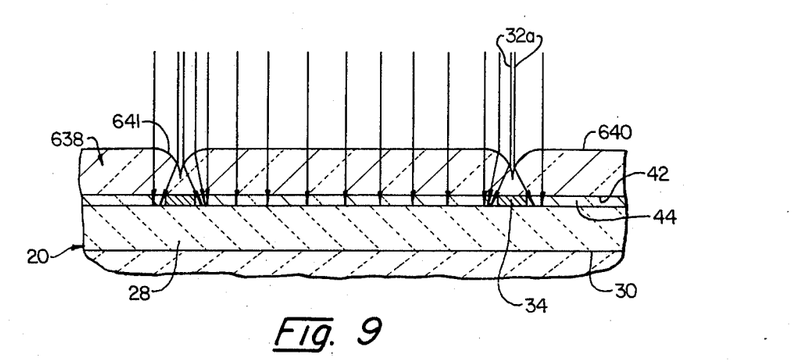
Figure 10:
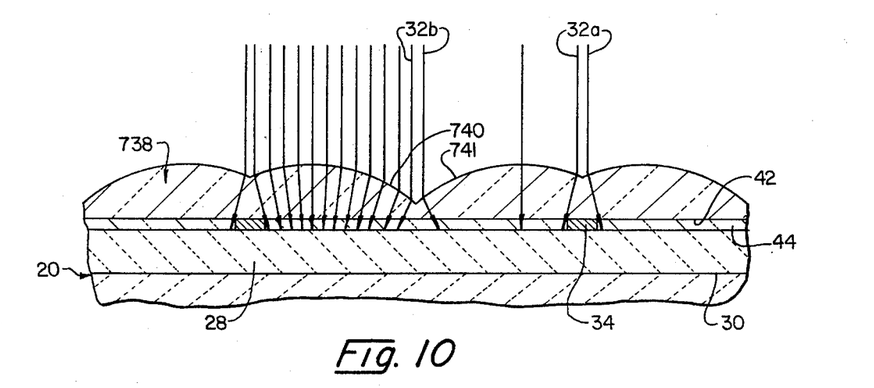

A number of alternative embodiments of the present invention are possible. Thus, the refractive surface (front surface 40 of transparent cover 38) need not be cylindrical. For instance, in the embodiment illustrated in FIG. 4, the deflection is accomplished prismatically at front surface 139, while in the embodiments illustrated in FIGS. 5 through 7 the refractive discontinuity is provided on the rear surface of the cover. In the embodiment of FIG. 8, both surfaces are employed to control the refraction. Finally, the embodiments of FIGS. 9 and 10 are variations on the cylindrical embodiments wherein the refraction is confined to the region near fingers 34 in the first instance and additional refraction is provided to deflect radiation away from the region midway between fingers 34 in the second.

Figure 4:
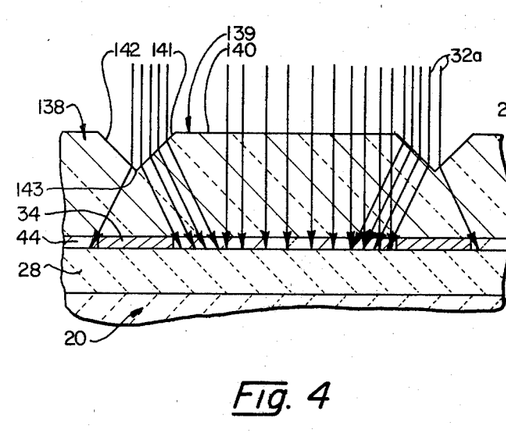
FIG. 4 through FIG. 10 are views, similar to FIG. 3, of alternative embodiments of the present invention.

In greater detail, in the embodiment illustrated in FIG. 4, front surface 139 comprises a repetitive array of planar surfaces 140, 141, and 142. Surface 140 is a substantially flat surface parallel to rear surface 42 of cover 138. Surfaces 141 and 142 are equally and oppositely inclined surfaces forming a plurality of incisions in surface 140. Surfaces 141 and 142 are arranged in pairs disposed to intersect surface 140 along pairs of parallel lines spaced apart a distance on the order of the width of a finger 34. Pairs of adjacent surfaces 141 and 142 are further disposed to intersect one another along lateral edges 143. Lateral edges 143 thus form a plurality of parallel lines disposed in a plane parallel to both surface 140 and rear surface 42. Additionally, edges 143 are disposed in spaced-apart relationship to one another by the center-to-center distance between adjacent pairs of fingers 34. Surfaces 141 and 142 are so inclined to surface 140, dependent upon the index of refraction and the thickness of cover 138, as to cause a minimum deflection of a ray normal to surface 140 and incident upon them on the order of half the width of a finger 34, as measured at rear surface 42. As surfaces 141 and 142 are incised into the front surface of cover 138, and as the cover is normally in air, this deflection is away from the respective lateral edge 143. Cover 134 is disposed with the lateral edges 143 parallel to and centered over fingers 34. In all other respects cover 134 is similar to transparent cover 38.

It will be obvious to those skilled in the art that, rather than being grooves in surface 140 of front cover 140, the prisms formed by surfaces 141 and 142 could be projections above surface 140. In the latter case, however, the minimum linear deflection required would be twice that required for the former. It will also be apparent that the projection of a pair of lateral surfaces 141 and 142 on surface 140 may be larger than the width of a finger 34. However, surface 140 must have a width at least as great as a finger 34 in order to avoid deflecting radiation onto a finger.

For some purposes (e.g., ease of cleaning, adequate drainage in any orientation, etc.) it may be desirable that the front surface of the cover be substantially flat. The configurations illustrated in FIGS. 5 through 7 provide such front surfaces 240.

Figure 5:
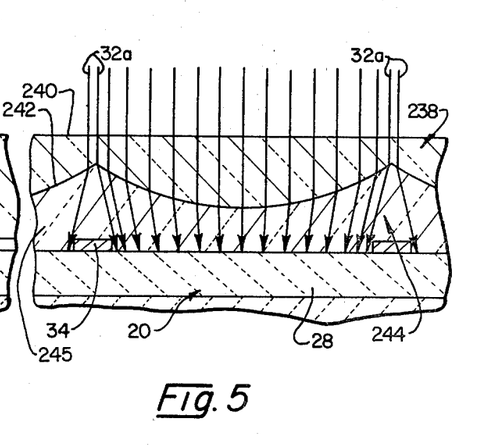

In the embodiment of FIG. 5, cover 238 has a flat front surface 240 disposed substantially parallel to layer 28 of semiconductor structure 20 and a rear surface 242 in the form of similar convex cylindrical segments. The segments making up rear surface 242 are arranged similarly to those making up front surface 40 of cover 38. However, since the desired refraction takes place at rear surface 242, rather than at the front surface, this surface must be spaced apart from structure 20, and it is this spacing, rather than the thickness of the cover, which must be considered in calculating the displacement of the marginal rays 32a. The spacing may be controlled by a peripheral gasket (not shown) or by filling the volume 244 between the cover and structure 20 with a solid or liquid encapsulant 245. It will be understood that the encapsulant 245 must have a refractive index different from that of cover 238; in the case illustrated, where rear surface 242 of the cover has convex form, the encapsulant must be of lower index than the cover. However, other configurations (e.g., providing the rear surface of the cover with concave section) would permit the use of an encapsulant with a larger index. Again, the volume 244 might be filled with air or an inert gas. In all other respects, cover 238 is similar to cover 38.

Figure 6:
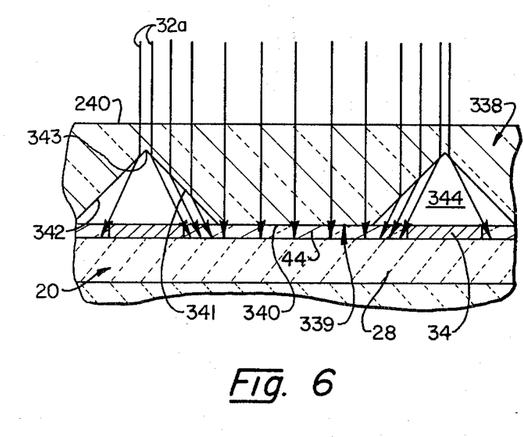

The embodiment illustrated in FIG. 6 accomplishes the deflection by prismatic refraction at the rear surface 339 of cover 338. Cover 338 has a flat front surface 240. Rear surface 339 comprises flat surfaces 340, 341, and 342 which are analogous to surfaces 140, 141, and 142 respectively of cover 138. Thus, surface 340 is parallel to surface 240, and surfaces 341 and 342 are equally and oppositely inclined, approaching surface 240 from surface 340 and meeting along lateral edges 343. Lateral edges 343 are aligned with the center lines of fingers 34. Since the refraction occurs at the rear surface of cover 338, the index of refraction and dimensions of volume 344 (and not the thickness of cover 338) must be considered, together with the index of the cover, in the design. As with cover 238, cover 338 is shown as a positive optical element, and consequently volume 344, as volume 244, must have an index lower than that of the cover. Further, the negative prism formed in effect by volume 344 must have a base wider than the width of a finger 34 sufficient to accommodate the foreshortened deflected beam of marginal rays 32a which would, if undeflected, intercept a finger. Importantly, it should be noted that the inclination of surfaces 341 and 342 to surface 340 (and to surface 240) must be less than the critical angle [i.e., the inclination must be less than $\sin^{-1}(n'/n)$, where n and n' are respectively the indices of refraction of cover 338 and volume 344] in order to avoid total internal reflection. Inasmuch as surface 340 is flat and is disposed parallel to layer 28, cover 338 may be easily cemented to the semiconductor structure by a simple thin layer 44 of cement. In all other respects, cover 338 may be similar to cover 138.

Figure 7:
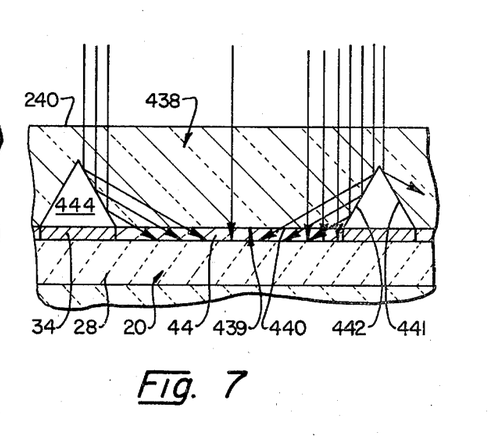

The embodiment of FIG. 7 is similar to that of FIG. 6 except that, deliberately, surfaces 441 and 442 have been inclined to surface 440 (and surface 240) by an angle greater than the critical angle. Thus, at these surfaces, total internal reflection occurs. As a consequence, the base of volume 444, otherwise similar to volume 344, ideally matches the width of a finger 34. In all other respects, cover 438 is similar to cover 338.

As previously noted, both surfaces of the cover may be used to control both angular and linear deflection of the marginal rays. As may be seen with reference to FIG. 8, cover 538 is in the form of a multiple concavo-convex cylindrical structure having front and rear surfaces 540 and 542 respectively. Front surface 540 is similar to front surface 40 of cover 38, whereas rear surface 542 is in the form of a series of concave cylindrical segments. The cylindrical segments making up surfaces 540 and 542 are of similar spacing and orientation. Further, the cylindrical segments of surfaces 540 and 542 are optically centered with regard to one another (i.e., corresponding front and rear cylindrical segments are so aligned that the plane joining their respective cylindrical axes bisects the segments). As an aid to mounting cover 538 to the cell, flat surfaces 543 are provided at the junction between adjacent cylindrical segments. Surfaces 543 are dimensioned to cover fingers 34. Cover 538 may be mounted to the cell by a thin layer of cement (not shown) between surfaces 543 and fingers 34. As with the other embodiments involving refraction at the rear surface, volume 544 between rear surface 542 and layer 28 is filled with a material, such as air or an inert gas, which is of a lower index than that of cover 538. In all other respects, the structure of FIG. 8 is similar to the other embodiments described hereinabove.

It will be noted that the cylindrical lens embodiments (FIGS. 2, 3, 5, and 8) more-or-less uniformly concentrate the energy incident upon the cell, whereas the prismatic forms (FIGS. 4, 6, and 7), in deflecting only the marginal rays, can be made to concentrate the energy into the vicinity of fingers 34 (as is clearly illustrated for the embodiment of FIG. 4). As a result, such embodiments not only serve to reduce shadowing loss (by deflecting the energy otherwise incident upon the fingers into the active material) and series resistive losses (by allowing larger and more closely spaced fingers 34), but further reduce lateral resistive losses within layer 28 (by insuring a greater portion of the electron-hole pairs to be formed near a finger 34).

The configurations depicted in FIGS. 9 and 10 are additional examples taking advantage of this last mentioned feature. Referring to FIG. 9, there may be seen cover 638 provided with a refractive front surface including substantially flat sections 640 and curved sections 641. Flat sections 640 are substantially parallel to rear surface 42, and are dimensioned and disposed so as to be opposite the front surface of cell 20 clear of fingers 34. Curved sections 641 are pairs of intersecting cylindrical segments with parallel axes. Curved sections 641 are disposed to intercept flat sections 640 on a tangent and are convex to rear surface 42. Curved sections 641 are spaced apart by the center-to-center spacing of fingers 34, and each pair of cylindrical segments making up a curved section extends the width of a finger 34 between the points where the two cylindrical surfaces are tangent to flat section 640. The axes of the cylindrical surfaces forming curved sections 640 are disposed parallel to the axes of fingers 34. The curvature of curved sections 641 and the thickness of cover 638 are chosen on the basis of the index of refraction of the cover so as to deflect marginal rays 32a, which otherwise would be incident on the middle of a finger 34 transversely a distance on the order of half the width of a finger. It will be appreciated that this configuration, as the prismatic configurations of FIGS. 4, 6, and 7, deflects only marginal rays.

The embodiment of FIG. 10 is additionally configured to deflect central rays 32b, which would otherwise be incident on the cell midway between fingers 34, toward the fingers, thereby further reducing lateral resistive losses within layer 28. Cover 738 is provided with a front refracting surface in the form of a pair of intersecting cylindrical segments 740 and 741. Segments 740 and 741 are both convex with regard to back surface 42 of cover 738, and have parallel axes disposed parallel to the axes of fingers 34. Segments 740 and 741 are disposed to intersect opposite fingers 34 and midway between fingers 34. The curvatures of segments 740 and 741 and the thickness of cover 738 are selected so as to deflect a marginal ray 32a which would otherwise be incident on the middle of a finger 34 transversely a distance on the order of half the width of a finger. The provision of a pair of cylindrical lenses for each unobstructed portion of the cell also allows energy which would otherwise fall midway between the fingers to be deflected toward the fingers. It will be appreciated that the deflection of a central ray 32b need not be the same as that of a marginal ray 32a. In the embodiment shown, the axes of segments 740 and 741 have been disposed nearer to fingers 34 than to the midpoint between fingers, with the result that the deflection of a central ray 32b is greater than that of a marginal ray 32a.

While generally the greatest efficiency would be achieved for cells illuminated normally, as illustrated, it will be appreciated that the various designs would still offer improved performance when otherwise illuminated, and that further, the designs can be modified to better adapt the cells to such operation.

Yet other variations in structure are possible. Thus, the front electrode need not be arranged in a simple comb-like pattern, but might be a multi-level grid (i.e., a grid in which a set of parallel fingers serve to interconnect another plurality of smaller fingers normal to the first), nor need the widths of the individual fingers in the electrode be constant along their lengths. For a multi-level front electrode, a tessellated optical element might be employed. Similarly, a crossed optical element may be employed to provide for shadowing losses from both fingers and bus bar in those cells that are not to be used in a shingle-like array. Tapered electrodes and varying grid spacing might be accommodated by varying the power of the optical element from region to region. Additionally, those skilled in the art will recognize that either the cylindrical or prismatic forms described might be realized with Fresnel (step-lens) type designs, the contour of the refractive surface being segmented. It will also be understood that for those embodiments involving refraction at the rear surface, the sign of the curvature of the surface may be changed by introducing a medium of higher index than the cover between the cover and the cell.

Since the above noted and other changes may be made in the apparatus herein described without departing from the scope of the invention herein involved, it is intended that all matter contained in the above description or shown in the accompanying drawings shall be interpreted in an illustrative and not in a limiting sense.

What is claimed is:

1. A solar cell assembly comprising in combination
   a solar cell for generating an electrical current in response to electromagnetic radiation, said cell having a front surface and an electrode obscuring a plurality of regions of said front surface, said regions each having a characteristic dimension in a first direction and being spaced from one another along said first direction in a predetermined spatial frequency, said electrode comprising a comb-like array of equally spaced-apart like conductors;
   a transparent front cover of predetermined refractive index having opposed first and second surfaces, said first surface facing said front surface of said cell and confronting a medium having a refractive index different from said predetermined refractive index, said first surface having a contour comprising a plurality of substantially identical cylindrical segments having a like plurality of substantially cylindrical axes, adjacent ones of said cylinder axes being spaced apart a distance similar to that between adjacent ones of said conductors, each of said cylinder axes being disposed (a) in a plane substantially parallel to said conductors, (b) parallel to individual conductors, and (c) equidistant from an adjacent pair of said conductors, said cylinders being dimensioned and disposed so that selected rays of said radiation incident upon them are deflected through a predetermined angle and directed to regions of said front surface which are not obscured by said electrode, and said second surface being a substantially planar surface parallel to said cylinder axes; and
   means securing said front cover to said cell in overlaying relation to said front surface with said first surface positioned at a predetermined distance from said electrode.

2. The assembly according to claim 1 wherein said cylindrical segments are convex with regard to said planar surface and the medium confronting said first surface is of lower refractive index than said predetermined refractive index.

3. A solar cell assembly comprising in combination
   a solar cell for generating an electrical current in response to electromagnetic radiation, said cell having a front surface and an electrode obscuring a plurality of regions of said front surface, said regions each having a characteristic dimension in a first direction and being spaced from one another along said first direction in a predetermined spatial frequency, said electrode comprising a comb-like array of equally spaced-apart parallel like conductors;
   a transparent front cover of predetermined refractive index having opposed first and second surfaces, both of said first and second surfaces confronting a medium having a refractive index different from said predetermined refractive index, said first and second surfaces having first and second contours respectively, each of said contours being in the form of a plurality of substantially identical cylindrical segments having a like plurality of substantially coplanar cylinder axes, adjacent ones of said cylinder axes being spaced apart a distance similar to that between adjacent ones of said conductors, each of said cylinder axes being disposed (a) in a plane substantially parallel to said conductors, (b) parallel to individual conductors, and (c) equidistant from an adjacent pair of said conductors, said cylinders being dimensioned and disposed so that selected rays of said radiation incident upon said cylinders are directed to regions of said front surface which are not obscured by said electrode; and
   means for securing said front cover to said cell in overlaying relation to said front surface so as to maintain said first and second surfaces at predetermined distances from said front surface.

4. The assembly according to claim 3 wherein said cylindrical segments forming said first contour are convex, said cylindrical segments forming said second contour are concave, and further wherein said second surface faces said front surface of said cell and the medium confronting said second surface is of lower refractive index than said predetermined refractive index.

5. The assembly according to claim 4 wherein said second surface includes a plurality of planar sections parallel said cylinder axes, each of said planar sections extending between a pair of said cylindrical sections, and each of said planar sections having an extent in said first direction substantially equal to said characteristic dimension.

6. The assembly according to claim 3 wherein the cylindrical segments defining said first contour are substantially identical to the cylindrical segments defining said second contour.

7. A solar cell assembly comprising in combination
   a solar cell for generating an electrical current in response to electromagnetic radiation, said cell having a front surface and an electrode obscuring a plurality of regions of said front surface, said regions each having a characteristic dimension in a first direction and being spaced from one another along said first direction in a predetermined spatial frequency, said electrode comprising a comb-like array of equally spaced-apart parallel like conductors;
   a transparent front cover of predetermined refractive index having opposed first and second surfaces, said first surface confronting a medium having a refractive index different from said predetermined refractive index, said first surface having a contour, said contour having a spatial frequency along said first direction corresponding to the spatial frequency of said regions, said contour including a plurality of pairs of cylindrical segments, each segment having an axis substantially parallel to said conductors, each pair being disposed such that the segments intersect in a line substantially in opposing relationship to a one of said conductors, said cylindrical elements being dimensioned so that selected rays of said radiation incident near said lines are deflected through a predetermined angle and directed to regions of said front surface which are not obscured by said electrode; and
   means for securing said front cover to said cell in overlaying relation to said front surface so as to maintain said first surface at a predetermined distance from said electrode with said lines in a selected alignment with said regions, said predetermined distance being selected so that no less than one half of said characteristic dimension subtends said predetermined angle at said predetermined distance; and said alignment being selected to that said regions and zones are disposed along a path parallel to an incident ray of said radiation.

8. The assembly according to claim 7 wherein said axes are disposed to be nearer said conductors than to a line midway between adjacent said conductors.

9. The assembly according to claim 8 wherein said contour includes a plurality of substantially planar sections tangent to and connecting adjacent ones of said first plurality.

10. A solar cell assembly comprising in combination
a solar cell for generating an electrical current in response to electromagnetic radiation, said cell having a front surface and an electrode obscuring a plurality of regions of said front surface, said regions each having a characteristic dimension in a first direction and being spaced from one another along said first direction in a predetermined spatial frequency, said electrode comprising a comb-like array of spaced-apart like conductors;
a transparent front cover of predetermined refractive index having opposed first and second surfaces, said first surface at least in part confronting a medium having a refractive index different from said predetermined refractive index, said first surface having a contour comprising a plurality of spaced-apart identical prismatic sections, each of said sections being defined by a pair of intersecting lateral faces disposed to make equal but opposite angles, each greater than the critical angle, with a plane parallel said front surface, said pair of lateral faces intersecting along a line which is parallel to and centered opposite one of said conductors, said contour having a spatial frequency along said first direction corresponding to the spatial frequency of said regions, said lateral faces being dimensioned and disposed so that selected rays of said radiation incident upon said lateral faces are deflected through a predetermined angle and directed to regions of said front surface which are not obscured by said electrode, the projection of each of said prismatic sections on a plane parallel to said lines having a size along said first direction substantially the same size as said characteristic dimension, said first surface also including a plurality of planar sections parallel to said planar surface, each of said planar sections extending between a pair of said prismatic sections on a plane parallel to said lines, each said planar section having a size along said first direction substantially the same as the separation between adjacent said conductors, and said second surface being a substantially planar surface parallel to said lines and spaced apart from said first surface; and
means securing said front cover to said cell in overlaying relation to said front surface with said first surface facing said front surface so as to maintain said first surface at a predetermined distance from said electrode with said prismatic sections in a selected alignment with said regions, said predetermined distance being selected so that no less than one half of said characteristic dimension subtends said predetermined angle at said predetermined distance, said alignment being selected so that said regions and zones are disposed along a path parallel to an incident ray of said radiation.

* * * * *

UNITED STATES PATENT AND TRADEMARK OFFICE
CERTIFICATE OF CORRECTION

PATENT NO. : 4379202
DATED : April 5, 1983
INVENTOR(S) : Bruce Chalmers

It is certified that error appears in the above-identified patent and that said Letters Patent is hereby corrected as shown below:

Claim 7, column 10, line 56, before "plurality" insert the word -- first --.

Claim 7, column 11, line 6, the word "to" should be -- so --.

Signed and Sealed this

Thirtieth Day of August 1983

[SEAL]

Attest:

GERALD J. MOSSINGHOFF

Attesting Officer

Commissioner of Patents and Trademarks